United States Patent [19]

Sakamoto et al.

[11] Patent Number: 5,185,534
[45] Date of Patent: Feb. 9, 1993

[54] MONOLITHIC PARALLEL CONNECTED TRANSISTOR STRUCTURE

[75] Inventors: Shinichi Sakamoto; Takuji Sonoda; Nobuyuki Kasai, all of Itami, Japan

[73] Assignee: Mitsubishi Denki Kabushiki Kaisha, Tokyo, Japan

[21] Appl. No.: 709,161

[22] Filed: Jun. 3, 1991

[30] Foreign Application Priority Data

Nov. 2, 1990 [JP] Japan .................................. 2-298679

[51] Int. Cl.$^5$ ............................................ H01L 29/80
[52] U.S. Cl. ..................................... 257/276; 257/280; 257/287; 257/523
[58] Field of Search ................... 357/22 H, 22 I, 22 R, 357/56, 65, 68

[56] References Cited

U.S. PATENT DOCUMENTS

| 3,737,743 | 6/1973 | Goronkin et al. | 357/22 H |
| 4,313,126 | 1/1982 | Krumm et al. | 357/22 H |
| 4,996,582 | 2/1991 | Nagahama | 357/69 |
| 5,023,677 | 6/1991 | Truitt | 357/22 |
| 5,025,296 | 6/1991 | Fullerton et al. | 357/22 |
| 5,084,750 | 1/1992 | Adlerstein | 357/55 |

FOREIGN PATENT DOCUMENTS 62-274669 11/1987 Japan .................................. 357/22 A

OTHER PUBLICATIONS

Itoh et al, "Fabrication Of Super Low Noise HEMT . . . Characteristics", Research Reports Of The Institute Of Electronics And Communication Engineers Of Japan, vol. 88, No. 60, 1988 (May).
Bastida et al, "Airbridge Gate FET For GaAs Monolithic Circuits" IEEE Transactions On Electron Devices, vol. Ed-32, No. 12, 1985, pp. 2754-2759.

Primary Examiner—Andrew J. James
Assistant Examiner—Courtney A. Bowers
Attorney, Agent, or Firm—Leydig, Voit & Mayer

[57] ABSTRACT

At least two unit transistor groups, each including unit transistors arranged along a straight line, are disposed on a substrate parallel to and facing each other. Each transistor in one group and a facing transistor in the other group have integral first, second, and control electrodes. The first, second, and control electrodes of the unit transistors are connected to associated respective electrode pads.

6 Claims, 4 Drawing Sheets

MONOLITHIC PARALLEL CONNECTED TRANSISTOR STRUCTURE

This invention relates generally to a semiconductor device used chiefly in a microwave band and more particularly to a semiconductor device including a combination of a plurality of groups of unit transistors so as to provide high output power.

BACKGROUND OF THE INVENTION

A semiconductor device including GaAs field effect transistors (FET's) used in a super high frequency band, for example, in a frequency band of from several gigahertz to tens of gigahertz, includes a number of unit FET's or groups of unit FET's which are connected in parallel on one single chip, in order to provide high output power.

FIG. 1 is a plan view of an example of a conventional semiconductor device including one group of unit transistors arranged on a chip. In FIG. 1, a plurality of unit FET's are disposed on a given active region formed on a substrate of, for example, GaAs, with drain electrodes 2 of the respective FET's being equally spaced to form a comb-like shape. Respective ends of the drain electrodes 2 are connected to a common drain electrode pad 3. Also, a plurality of source electrodes 4 are disposed in a comb-like form on the active region, with a predetermined spacing from adjacent drain electrodes 2. Respective ends of the source electrodes 4 are connected to a common source electrode pad 5. Gate electrodes 6 are disposed on the active region between adjacent drain and source electrodes. Respective ends of the gate electrodes 6 are connected to a common conductor 7 which, in turn, is connected to a gate electrode pad 8. At the intersections of the source electrodes 4 with the gate conductor 7, the source electrodes 4 pass over the conductor 7 with an insulating film and a gap interposed therebetween. Each gate electrode, associated source and drain electrode, and the associated active region in the substrate is referred to here as a unit transistor.

When the above-described semiconductor device is handling a signal of a frequency of from several gigahertz to tens of gigahertz the length Lg, along the channel direction, of the gate electrode 6 of each of the unit FET's is from about 0.4 μm to about 0.7 μm and the width Wg of each gate electrode 6 is 60–100 μm so that parasitic components (e.g. gate resistance) which have significant effects on the characteristic of the device can be reduced and, therefore, reduction of the gain of the device can be prevented.

In order to obtain high output power from a conventional semiconductor device with the above-described structure, it is necessary to increase the total gate width by making the product of the width Wg of each gate electrode 6 and the number of gate electrodes large. However, in order to provide a larger total gate width with a small width of each gate electrode 6, the chip tends to be laterally elongated excessively. Accordingly, the width of each gate electrode should be limited. If a larger gate width Wg of each gate electrode is used, the signal phase at the terminating end of the gate electrode 6 deviates from the signal phase at the input end (i.e. that end which is connected to the gate conductor 7), so that the signal is distorted.

A structure of another conventional semiconductor device is shown in FIG. 2, which was proposed to eliminate the above-described disadvantages. In the structure illustrated in FIG. 2, the width Wg of the gate electrode of each unit FET is reduced to about one half, namely, from 30 μm to 50 μm, and the decrease in output power caused by the reduction of the width Wg of the gate electrodes is compensated for by increasing the number of groups of unit transistors used.

Referring to FIG. 2 and FIG. 3 which shows the cross-section along $Y_1$–$Y_1$ in FIG. 2, a plurality of drain electrodes 21 of the unit FET's are disposed on a predetermined active region formed on a substrate of, for example, GaAs. The drain electrodes 21 are equally spaced from each other to form a comb-like shape. Respective ends of the drain electrodes 21 are connected to associated common drain electrode pads 31. Also a plurality of source electrodes 41 are formed on the active region with a given spacing disposed between adjacent drain electrodes 21. The source electrodes are disposed in a comb-like shape and have respective ends connected to a common source electrode pad 51. Gate electrodes 61 are disposed between adjacent drain and source electrodes 21 and 41. Respective ends of the gate electrodes 61 are connected to a common conductor 71 which, in turn, is connected to common gate electrode pads 81. As in the example shown in FIG. 1, in the case of FIG. 2, too, where the gate electrode conductor 71 intersects the source electrodes 41, the source electrodes 41 pass over the conductor 71 with an insulating film and a gap disposed therebetween.

The width Wg of each gate electrode of the semiconductor device of FIG. 2 is reduced to about one half the width in the device of FIG. 1, and, therefore, signal phase deviation between the input end of each gate electrode 61 (that end which is connected to the conductor 71) and the tip end is small. Thus, satisfactory characteristics are exhibited by the device even at a super high frequency of from several gigahertz to tens of gigahertz. Furthermore, since two groups 10 and 20 of unit transistors are provided, the reduction in output power which could caused by the reduction of the width Wg of the gate electrodes 61 can be compensated for, so that sufficiently high output can be obtained even at a super high frequency of from several gigahertz to tens of gigahertz.

The conventional semiconductor device shown in FIG. 2 has a structure in which the unit transistor groups 10 and 20 are arranged in a row. Accordingly, if a number of groups of unit transistors are arranged in a row in order to produce high output, the dimensional balance of the substrate chip would be lost and the substrate chip would become very long. If the chip becomes elongated, it tends to be easily broken during handling and also to warp. Furthermore, the number of bonding wires for applying an input signal increases, which introduces variations in length of the bonding wires, which, in turn, could cause input signal phase deviations. In addition, because the number of the gate electrode bonding pads 81 increases, fringing capacitance increases due to an increase in the number of the gate bonding pads 81 and wires connecting the respective gate electrodes to the gate bonding pads 81, so that high frequency characteristics are degraded.

A structure of a microwave high output transistor device with balanced dimensions of a substrate chip and with a number of FET's arranged on the chip to provide high output is shown, for example, in Japanese Published Patent Application No. SHO 60-37170. Its basic structure is shown in FIG. 4. Referring to FIG. 4, source electrodes 13A, 13B, 13C and 13D are disposed on a substantially square substrate 12. The source electrodes are disposed parallel to the sides of the square substrate 12. The source electrodes are connected to associated source electrode pads 14A, 14B, 14C and 14D. Drain electrodes 15A, 15B, 15C and 15D are connected to a common drain electrode pad 16 located in a central portion of the substrate 12. Gate electrodes 17A, 17B, 17C and 17D are located between source and drain electrodes that are adjacent to each other. The gate electrodes 17A and 17D are connected via associated gate connecting conductors 18A and 18B to a first gate electrode pad 19A, while the gate electrodes 17B and 17C are connected via associated gate connecting conductors 18B and 18C to a second gate electrode pad 19B.

The substrate chip of the semiconductor device disclosed in this Japanese Published Patent Application No. SHO 60-37170 which has the structure shown in FIG. 4 is square, and, accordingly, the tendency of the substrate to be broken or to warp is significantly reduced relative to the semiconductor device shown in FIG. 2. However, because some FET's (e.g. FET's of groups A and C) are orthogonal to the remaining FET's (e.g. FET's of groups B and D) on the substrate 12, FET's arranged in one direction and FET's arranged in the orthogonal direction are differently processed, e.g. etched, due to difference in crystal orientation. Furthermore, stresses applied by a surface protection film to FET's arranged in different directions are different. This causes the gate threshold voltage of the FET's of groups A and C to differ from that of the FET's of groups B and D. In addition, this structure requires that the drain electrode pad 16 be large, so that the substrate area must be large.

The object of the present invention is to eliminate all of the above-described problems, by providing a semiconductor device which includes a number of transistors, such as FET's, disposed on a chip having balanced longitudinal and lateral dimensions, with the numbers of bonding pads and bonding wires minimized so as to reduce the capacitances caused by bonding pads and wires. According to the present invention, the width Wg of the gate of a unit transistor is reduced so as to minimize input signal phase deviations and also gate resistance. Thus, the proposed semiconductor device can provide high output power at super high frequencies.

SUMMARY OF THE INVENTION

According to the present invention, at least two unit transistor groups each comprising a plurality of unit transistors arranged in a row are disposed in parallel and face each other with each transistor in one group facing a transistor in the other group on a substrate chip, with the first main electrodes of respective unit transistors of the groups being connected directly to a single first main electrode pad, with second main electrodes of the respective unit transistors of the groups being connected directly to a single second main electrode pad, and with control electrodes of the respective unit transistors of the groups being connected in common to a single control electrode pad by means of an airbridge.

In a semiconductor device of the present invention, a plurality of unit transistor groups are disposed in parallel and to face each other. Accordingly, the lateral dimension of the substrate chip (i.e. the dimension of the chip along the direction in which the unit transistors are arranged) is reduced, so that the balance between the longitudinal and lateral dimensions of the chip is improved. Furthermore, since an input signal is applied to the control electrodes of the unit transistor groups via a common bonding pad, the number of necessary bonding pads does not increase. Rather, the number of bonding pads is less than one half the number of bonding pads required for a device having unit transistors groups disposed in a conventional manner. Thus the degree of integration of components on a chip increases. Furthermore, because of the control electrodes being connected to an associated bonding pad through an airbridge, the electrostatic capacitance between conductors for the control electrodes and ground does not increase, and degradation of high frequency characteristics of the device is prevented. That characteristic degradation would otherwise be caused by an increase in fringing capacitance which, in turn, would be caused if the gate electrodes were interconnected by conductors formed on the substrate. Thus, a high gain can be obtained at super high frequencies.

DETAILED DESCRIPTION OF PREFERRED EMBODIMENTS

Now, the present invention is described with reference to an embodiment shown in FIGS. 5-8.

Figure 6:
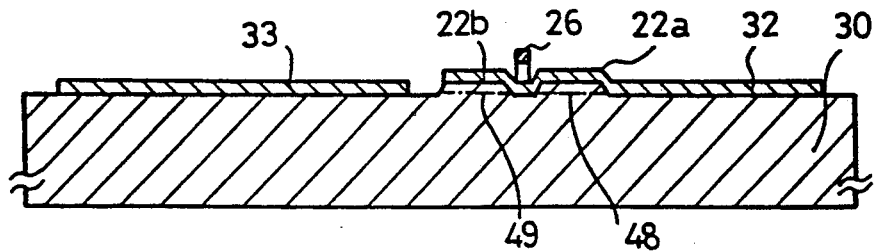
FIG. 6 is a cross-sectional view along $X_1$—$X_1$ of FIG. 5.
Figure 7:
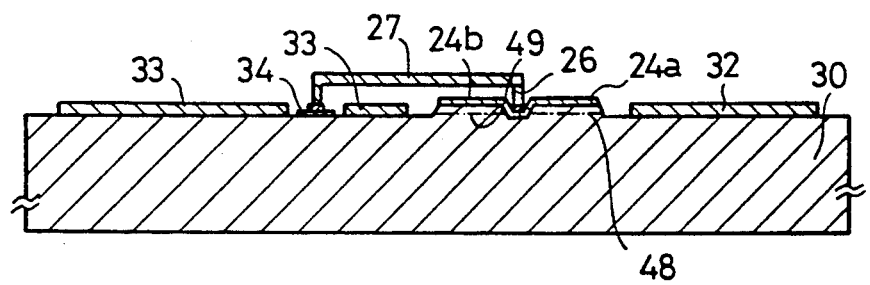
FIG. 7 is a cross-sectional view along $X_2$—$X_2$ of FIG. 5.
Figure 8:
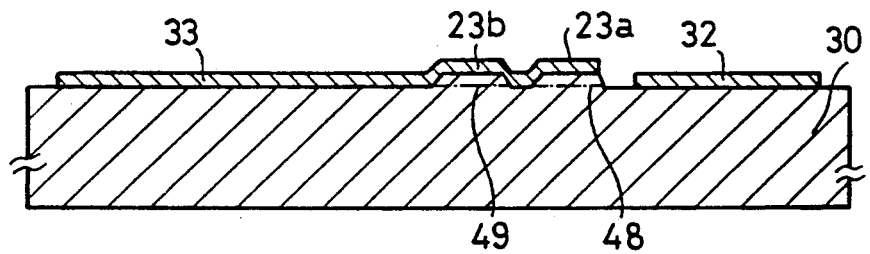
FIG. 8 is a cross-sectional view along $X_3$—$X_3$ of FIG. 5.

A first unit transistor group 35A including a plurality of unit transistors arranged in a row, and a second unit transistor group 35B including a plurality of unit transistors arranged in a row are formed on associated predetermined active regions formed in a substrate 30 of, for example, GaAs. The unit transistors may be, for example, FET's. The unit transistor groups are parallel to and face each other with unit transistors in the group 35A facing respective associated unit transistors in the group 35B. In the illustrated embodiment, as shown in FIGS. 6, 7 and 8, the active region 48 on which the first unit transistor group 35A is formed and the active region 49 on which the second unit transistor group 35B are formed are separated by forming the regions in the form of mesas ("mesa-separation"). Alternatively, the active regions may be separated by an isolation region formed by ion implantation ("implantation-separation").

On the respective active regions, a plurality of drain electrodes 22a of the first unit transistor group 35A and a plurality of drain electrodes 22b of the second unit transistor group 35B are disposed equally spaced from each other. As is seen from FIG. 6, the drain electrodes 22a are connected to their respective associated drain electrodes 22b at a location between the regions 48 and 49, and the thus mutually connected drain electrodes are connected at the ends of the electrodes 22a to a common drain electrode pad 32. Thus, the drain electrodes 22a and 22b are arranged in a comb-shaped pattern.

On the active regions, a plurality of source electrodes 23a of the first unit transistor group 35A and a plurality of source electrodes 23b of the second unit transistor group 35B are also disposed equally spaced from each other. As is seen from FIG. 8, the source electrodes 23a and their respective associated source electrodes 23b are connected together at a location between the active regions 48 and 49, and the thus connected source electrodes are connected at the ends of the source electrodes 23b to a common source electrode pad 33. Thus, the source electrodes are arranged in a comb-shaped pattern.

Figure 2:
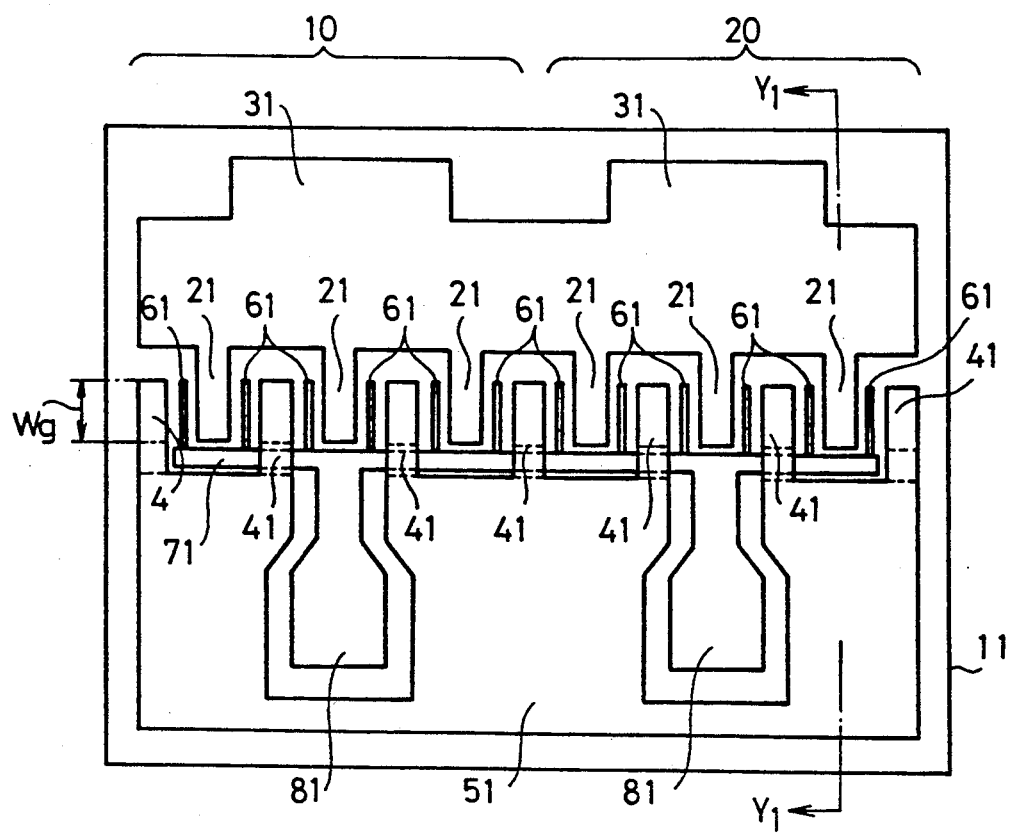
FIG. 2 is a plan view of a second example of conventional semiconductor device.

Between the drain electrodes 22a and their associated source electrodes 23a, and between the drain electrodes 22b and their associated source electrodes 23b, gate electrodes 24a of the first unit transistor group 35A and gate electrodes 24b of the second unit transistor group 35B are respectively disposed. As is seen from FIG. 7, the mutually associated gate electrodes 24a and 24b are connected to each other between the regions 48 and 49. In order for this semiconductor device to be used at super high frequencies of from several gigahertz to ten gigahertz odd, the length Lg of each of the gate electrodes 24a and 24b in the direction along the channels is from about 0.4 $\mu$m to about 0.7 $\mu$m, usually about 0.5 $\mu$m, and the width Wg is from 30 $\mu$m to 50 $\mu$m which is on the same order as that of the gate electrodes 61 of the conventional semiconductor device shown in FIG. 2.

The junctions of the gate electrodes 24a and 24b are commonly connected by means of a first airbridge 26, and the first airbridge 26 is connected by second airbridges 27 to a gate electrode pad 34. The gate electrode pad 34 is surrounded by and electrically insulated from the source electrode pad 33. The cross-sectional area of the airbridges 26 and 27 is significantly larger that that of each gate electrode, and usually it is about 4~5 $\mu$m × 1~2 $\mu$m.

With the above-described arrangement, an input signal is applied to, for example, the gate electrode pad 34 and then is applied in parallel to the respective FET's of the transistor groups 35A and 35B through the airbridges 27 and 26. An amplified signal is derived from, for example, the drain electrode pad 32.

Figure 4:
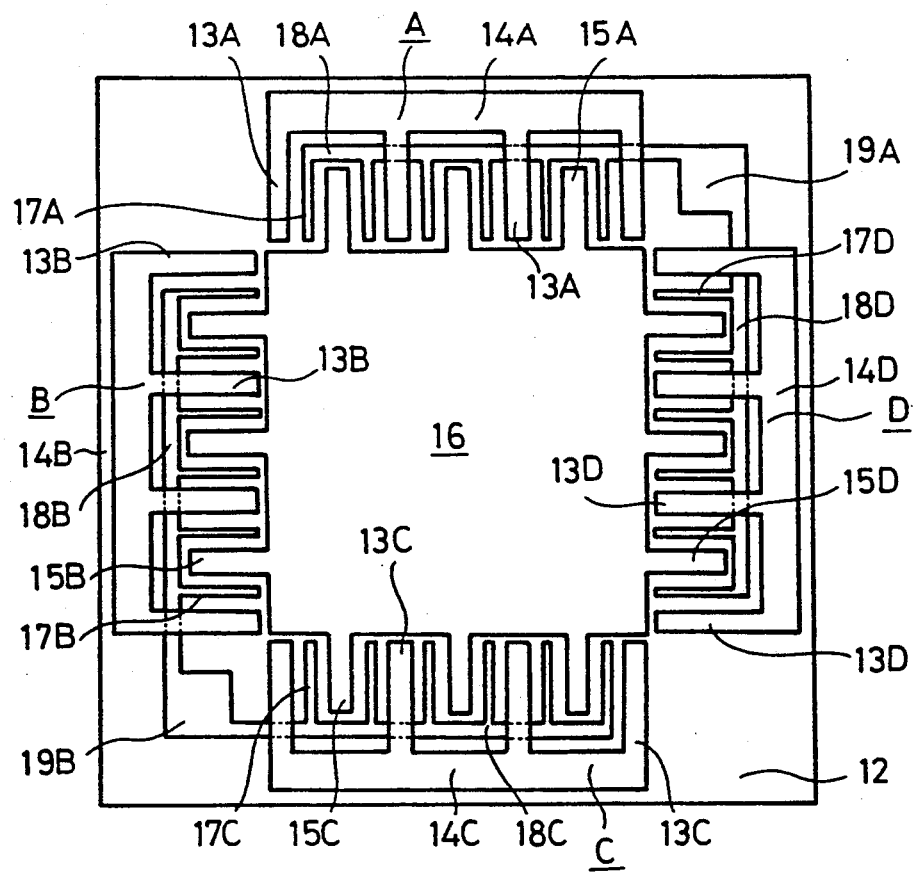
FIG. 4 is a plan view of a third example of conventional semiconductor device.
Figure 5:
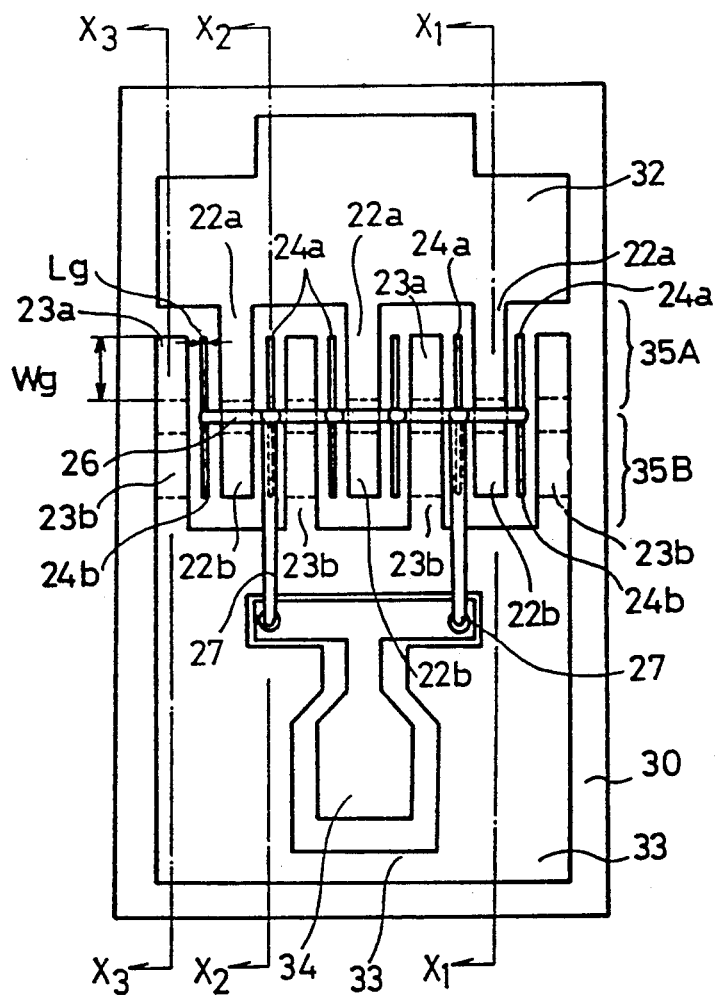
FIG. 5 is a plan view of a semiconductor device according to one embodiment of the present invention.

As described above, according to the present invention, more than two unit transistor groups, each comprising a row of a plurality of unit transistors, are arranged in parallel facing each other, with the facing unit transistor groups being isolated by mesa-separation or implantation-separation techniques, and an input signal is applied to the semiconductor device at a location between the facing unit transistor groups. With this structure, the width of the gate of each unit transistor can be reduced. Thus, in comparison with conventional semiconductor devices like the one shown in FIG. 2, in which unit transistors groups are arranged in a row for reduction of the width of each gate electrode, the longitudinal dimension (the dimension along the row of the unit transistors) of the chip is reduced substantially one-half. Accordingly, the balance between the longitudinal and lateral dimensions of the chip is improved, so that breakage of chips during handling and warpage of chips are greatly reduced. Furthermore, according to the present invention, all of the unit transistors are similarly oriented and, therefore, in comparison with conventional semiconductor devices like the one shown in FIG. 4 in which unit transistors are arranged along the respective sides of a substrate chip, processability in forming respective unit transistors is uniform and stress applied by a protective film formed over the respective FET's is also uniform, so that variations in various electrical characteristics, such as variations of threshold voltages of unit transistors, are greatly reduced.

According to the present invention, since an input signal is applied to the respective unit transistors through the junctions between the mutually parallel facing groups, the number of bonding pads is reduced to one-half in comparison with conventional devices and, accordingly, the degree of integration of components on the chip is greatly improved.

Figure 1:
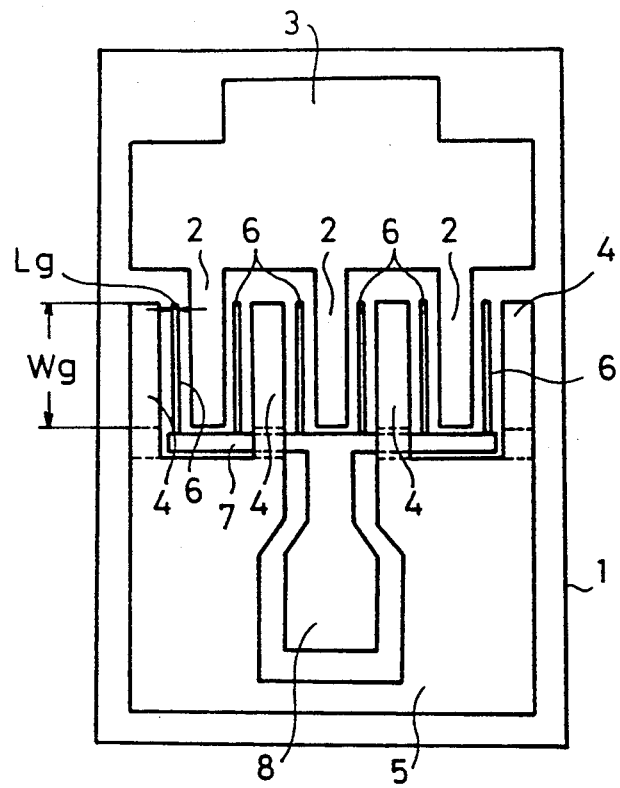
FIG. 1 is a plan view of a first example of conventional semiconductor device.
Figure 3:
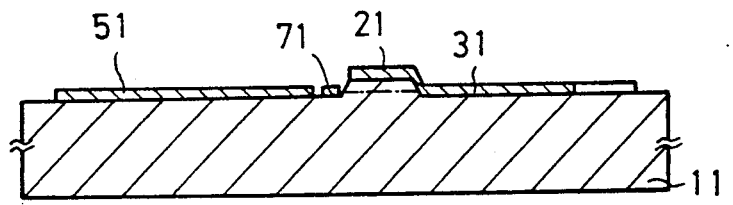
FIG. 3 is a cross-sectional view along $Y_1$—$Y_1$ of FIG. 2.

In addition, according to the present invention, the width Wg of the gate electrode of each unit transistor is reduced to about one-half that of the gate electrode in the conventional semiconductor device shown in FIG. 1, so that the gate resistance of each unit transistor is reduced one-half. Furthermore, since the connection from the gate electrode pad 34 to the gate electrodes 24a and 24b is provided by an airbridge arrangement, the electrostatic capacitance relative to ground is not increased and, at the same time, a reduction in gain which could be caused by an increase in fringing capacitance which, in turn, would be caused if the gate electrode conductor 71 (FIGS. 2 and 3) were used, is prevented. As a result, a high gain is provided at super high frequencies of from several gigahertz to tens of gigahertz.

The present invention has been described by means of an embodiment in which unit transistors are FET's, but it should be noted that the present invention is equally applicable to semiconductor devices including bipolar unit transistors.

What is claimed is:
1. A semiconductor structure including a plurality of transistors connected in parallel comprising:
   a semiconductor substrate including first and second mutually electrically isolated active regions;
   mutually electrically isolated first, second, and control electrode pads disposed on said substrate;
   a plurality of first electrodes disposed on said substrate connected to and continuously extending on said substrate from said first electrode pad across and contacting said first and second active regions;
   a plurality of second electrodes disposed on said substrate connected to and continuously extending on said substrate from said second electrode pad across and contacting said first and second active regions, each of said second electrodes being disposed between and spaced from a pair of first electrodes, thereby defining a plurality of areas on said substrate between neighboring first and second electrodes;
   a plurality of control electrodes disposed on said substrate extending, on said substrate, across and contacting said first and second active regions, said control electrodes being disposed on said substrate spaced from and between respective pairs of neighboring first and second electrodes; and
   an airbridge structure crossing over and electrically insulated from said first and second electrodes and electrically connecting said plurality of control electrodes to said control electrode pad.

2. The semiconductor structure of claim 1 wherein said transistors are field effect transistors, said first electrodes are drain electrodes, said second electrodes are source electrodes, and said control electrodes are gate electrodes.

3. The semiconductor structure of claim 1, wherein each control electrode has a length Lg of from 0.4 μm to 0.7 μm, and a width Wg of from 30 μm to 50 μm.

4. The semiconductor structure of claim 1 wherein said substrate is GaAs.

5. The semiconductor structure of claim 1 wherein said first and second active regions are respective mesa portions of said substrate.

6. The semiconductor structure of claim 1 including isolation regions in said substrate formed by ion implantation, mutually electrically isolating said first and second active regions.

* * * * *